United States Patent

Brown et al.

[11] Patent Number: 5,923,675
[45] Date of Patent: Jul. 13, 1999

[54] SEMICONDUCTOR TESTER FOR TESTING DEVICES WITH EMBEDDED MEMORY

[75] Inventors: Benjamin J. Brown, Lake Oswego, Oreg.; John F. Donaldson, Thousand Oaks; Kurt B. Gusinow, Agoura, both of Calif.

[73] Assignee: Teradyne, Inc., Boston, Mass.

[21] Appl. No.: 08/803,111

[22] Filed: Feb. 20, 1997

[51] Int. Cl.[6] .................................................. G01R 31/28
[52] U.S. Cl. ...................................... 371/22.31; 371/27.1
[58] Field of Search ................................ 371/22.31, 21.1, 371/27.1; 324/73.1, 158.1; 370/241, 537

[56] References Cited

U.S. PATENT DOCUMENTS

| | | | |
|---|---|---|---|
| 3,924,181 | 12/1975 | Alderson | 324/73 R |
| 4,409,683 | 10/1983 | Woodward | 370/112 |
| 5,355,415 | 10/1994 | Lee et al. | 380/47 |
| 5,390,192 | 2/1995 | Fujieda | 371/27.1 |

FOREIGN PATENT DOCUMENTS 2 206 715  1/1989  United Kingdom.

OTHER PUBLICATIONS

Rodriguez, C.W. et al., "The Development of Ultra–High Frequency VLSI Device Test Systems", Mar. 1, 1990, pp. 260–275.

*Primary Examiner*—Hoa T. Nguyen

[57] ABSTRACT

A semiconductor tester with features to facilitate testing of embedded memories. The circuitry allows tests to be generated algorithmically, but can be used in conjunction with scan test structures of semiconductor devices. Programming and debug time can be significantly reduced. The tester includes an algorithmic pattern generator that can generate a pattern for testing a memory. The tester also includes serializer circuits coupled to the algorithmic pattern generators that can convert the test pattern generated by the algorithmic pattern generator into one or more serial bit streams useful for scan testing an embedded memory.

16 Claims, 4 Drawing Sheets

SEMICONDUCTOR TESTER FOR TESTING DEVICES WITH EMBEDDED MEMORY

This invention relates generally to testing semiconductor components and more specifically to the testing of semiconductor components containing memory.

Semiconductors are generally fully tested during their manufacture. Automatic test equipment (called generally a "tester") is used to test semiconductor devices. A tester can generate and measure many signals. Each signal is connected to one lead on the device being tested. Each signal can be programmed so that any device can be connected to the tester and tested.

A tester for VLSI semiconductor circuits contains numerous channels. In most modern test systems, the circuitry in each channel generates or measures one test signal and each channel can be programmed independently.

FIG. 1 shows in block diagram format a prior art VLSI tester 130. Tester 130 includes numerous drivers 136 or comparators 138, each of which is connected to one lead 116 of a semiconductor device under test (DUT) 112.

The drivers 136 or comparators 138 each represent one channel. FIG. 1 shows a single driver 136 or a single comparator 138 making up each channel. More likely, every channel is the same and can be programmed to, at any time, either drive or measure a test signal. Also, each channel includes circuitry that can be programmed to control the time at which a signal is measured or provided to DUT 112. None of this circuitry is shown for simplicity.

Vector pattern memory 132 stores a test pattern. A test pattern is made up of a series, or pattern, of vectors. A vector is a set of data values for all the channels of tester 130. Timing circuitry (not shown) inside tester 130 ensures that one vector is executed for each cycle of the tester's operation. Execution of a vector means that the data is read from vector pattern memory and used to control the operation of all the channels. FIG. 1 shows that the values from vector pattern memory 132 are applied to drivers 136 and comparators 138.

The outputs of comparators 138 are provided to failure processor 134. The data from vector pattern memory 132 specifies what values comparators 138 should be detecting if DUT 112 is operating properly. Thus, the outputs of comparators 138 indicate whether DUT 112 has failed. Failure processor 134 might simply be a memory which stores these values. Failure processor 134 might perform more complicated logic functions to selectively store data from comparators 138 during only certain cycles of tester operation. For simplicity, the circuitry of failure processor 134 is not shown in detail.

FIG. 1 illustrates a particular problem in testing semiconductor devices. DUT 112 contains on board memories 118 and 120 and a logic section 114. Internal to DUT 112, memories 118 and 120 are connected to logic section 114. However, memories 118 and 120 contain many address and data inputs that would not be connected to leads 116 of DUT 112. Thus, once DUT 112 is packaged, access to the inputs and outputs of memories 118 and 120 is not available.

FIG. 1 shows one possible solution to this problem. Specifically, it shows what is sometimes known as "scan testing." For scan testing, DUT 112 is made with a scan input lead $116_{in}$ and an scan output lead $116_{out}$ connected to each memory. Memories 118 and 120 are made with "scan registers" (not shown) connected to their internal input or output lines. Data applied at scan input lead $116_{in}$ is shifted into the scan register. In this way, the data for all the input lines can be provided as a serial data stream through a single lead.

The process is repeated in reverse to measure the outputs of the memories 118 or 120. The data values on the internal output lines of memories 118 and 120 are latched into the scan register. These values are shifted out, one bit at a time, through scan output leads $116_{out}$.

Tester 130 is highly programmable to generate virtually any type of signal. It can thus be programmed with a vector pattern that provides the required data as a serial stream and analyzes the measurements. The drawback of this approach is that it is often complicated to write the test program for the memory.

The internal lines of a memory are usually not in the same order as the logical lines. For example, a memory might have a data bus with lines logically ordered D0 . . . D15. It might also have an address bus with lines logically ordered A0 . . . A7 and could further have a few control signal lines. When a device is designed, the lines corresponding to the data bus, address bus and control signal might appear in any order and might be interleaved. Thus, generating the serial data pattern can be complicated. For example, the first bit might be data bit D4, the next bit could be address bit A5, etc. To further complicate the situation, the memories 118 and 120 could have different physical layouts of their internal input, output and control lines. The vector pattern written to test memory 118 is therefore unlikely to be useful to test memory 120 even if memories 118 and 120 are logically equivalent.

An alternative to using scan testing is to provide a port for each memory, as shown in FIG. 2. The input and output lines of the memory might be accessible through leads 216. DUT 212 might be constructed so that certain of the leads 216 could be connected to the internal lines of memory 218. Those leads might serve a dual purpose of making a connection to logic section 214 at one time, but, in response to certain control signals used only for testing, might be switched to connect to the internal lines of memory 218.

Once a port is provided for memory 218, all the bits associated with one location of memory 218 can be read and written simultaneously.

FIG. 2 also shows a further enhancement. Algorithmic pattern generator 252 is included in tester 230. Algorithmic pattern generator 252 is a circuit that generates a series of data values and the address within memory 218 at which those values should be read or written to fully test memory 218. For example, a memory might be tested by writing into every location in the memory words that have an alternating pattern of 1's and 0's. When values in memory are read back, this same pattern should be repeated. The pattern might then be inverted, with the 1's being replaced by 0's and the 0's being replaced by 1's and the process repeated. These patterns can be generated by a circuit that is programmed to generate data with this pattern. It is not necessary that the actual pattern be stored. However, for this approach to work, it is necessary that the memory be accessible through a port.

To incorporate algorithmic pattern generator 252 into tester 230, a series of multiplexers 250 are used in each channel. Multiplexers 250, sometimes called "alternative data source" multiplexers, allow for each channel a selection between data from the algorithmic pattern generator 252 and data from vector pattern memory 232. The multiplexers allow algorithmic pattern generator 252 to be connected to any of the channels.

We have recognized that it would be highly desirable to combine the benefits of an algorithmic pattern generator and scan testing. In particular, it would be desirable to be able to rapidly program a tester for memory test. It would also be desirable not to have to dedicate large amounts of vector pattern memory to storing vectors to test a memory. In addition, it would be desirable to not need to supply a port for access to internal memories on a DUT. However, it is necessary that combining the advantages of these techniques not result in a high cost tester.

SUMMARY OF THE INVENTION

With the foregoing background in mind, it is an object of the invention to provide a tester for semiconductor components that can be simply programmed to test embedded memories.

It is also an object to provide a tester which can simply generate scan test signals for embedded memories.

It is a further object to provide a tester for semiconductor components with a memory test option with a programming format that facilitates easy debug of test programs.

The foregoing and other objects are achieved in a tester with a pattern generator connected to a data serializer circuit. The data serializer circuit converts test words into a serial stream for application to scan leads of a device under test.

In one embodiment, the data serializer circuit includes selection circuitry that allow the outputs of the pattern generator to appear in any order in the serial data stream.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
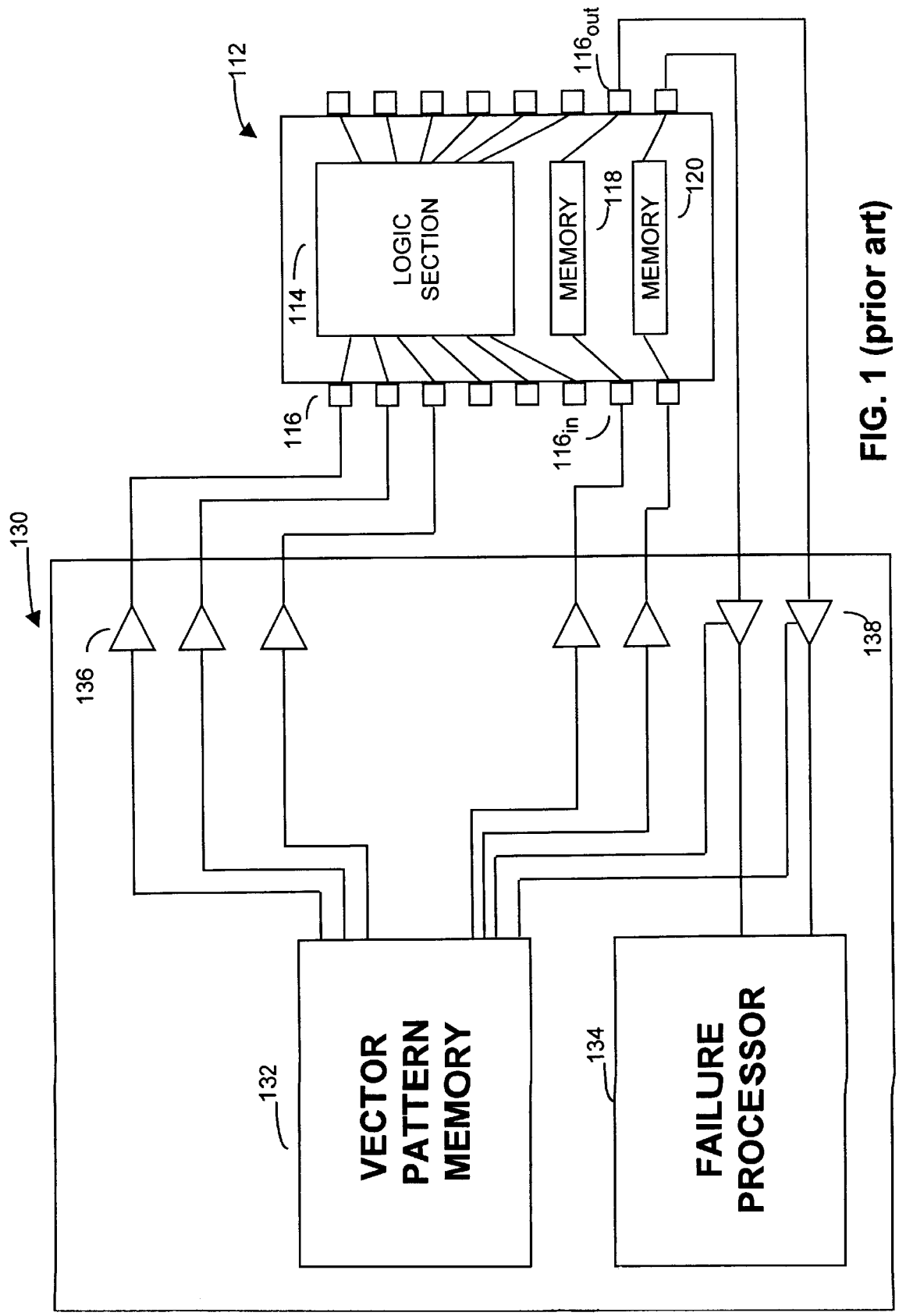
FIG. 1 is a block diagram of a prior art tester used for scan testing of a semiconductor component with embedded memory.
Figure 2:
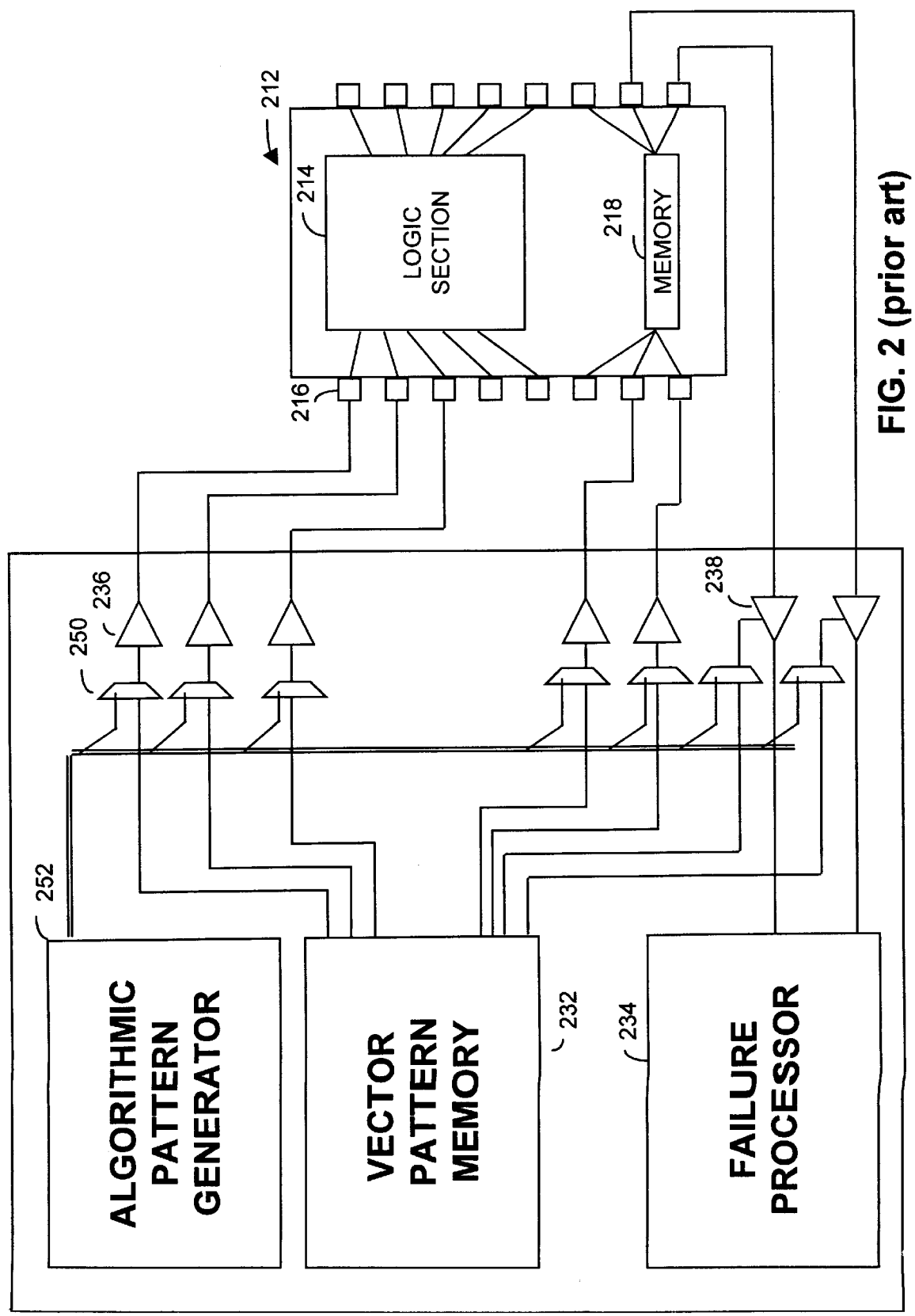
FIG. 2 is a block diagram of a prior art tester used for testing a semiconductor component with embedded memory and a test port.
Figure 3:
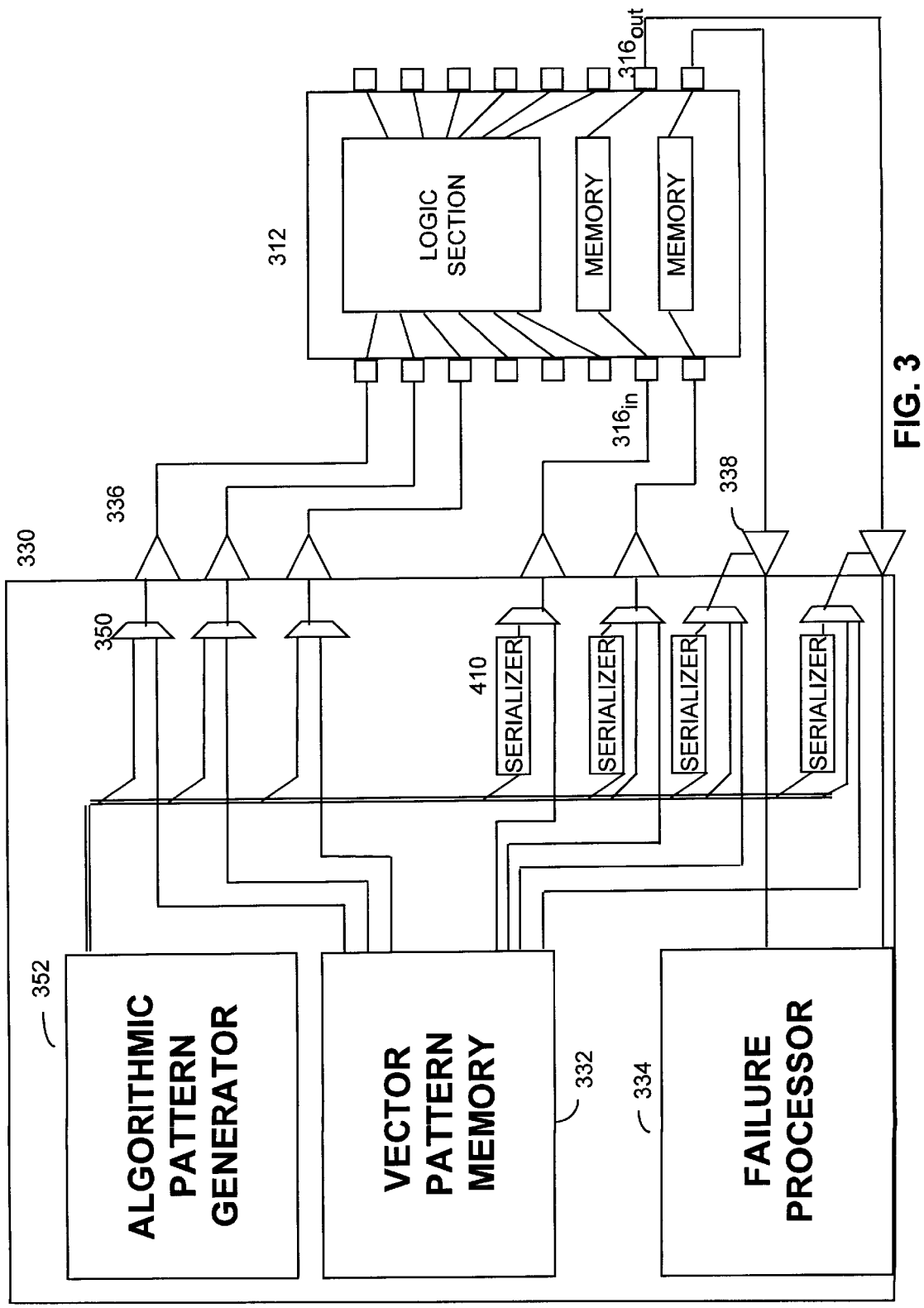
FIG. 3 is a block diagram of a tester according to the invention.

FIG. 3 shows a tester 330 capable of performing scan tests on an embedded memory with the data simply generated algorithmically. As will be described below, these features allow test programs to be developed quickly. Also, there is time saved when a test engineer must debug the test program.

Tester 330 includes vector pattern memory 332, failure processor 334 and algorithmic pattern generator 352, all as in the prior art. Also as in the prior art, tester 330 has numerous channels which include drivers 336 and comparators 338. The source of data for drivers 336 and comparators 338 is selected by alternative data source multiplexers 350.

Tester 330, however, has several channels that are equipped with serializer circuits 410. These channels can be connected to scan input leads 316$_{in}$ or scan output leads 316$_{out}$ on a device under test 312. Serializer circuits 410 convert algorithmically generated test data into a form suitable for use in scan testing. For the conversion, the data must be converted to serial data streams for scanning in and out. More importantly, the bits at the output of serializer 410 must have the order required to test the specific memories in the scan chain connected to a particular channel. For that reason, each serializer circuit 310 must be programmable so that the desired bits of the test pattern can be applied in the desired order.

FIG. 3 shows that there are four serializers 410. The number of serializer circuits is not important to the invention. There are preferably several serializer circuits to allow simultaneously scanning in and scanning out data from several scan chains on a single device under test. In a preferred embodiment, there is one serializer circuit 410 for every 16 channels.

As in the prior art, the output of algorithmic pattern generator 352 includes an address portion and a data portion. The address represents the signals that are applied to the address lines of the memory under test. The data portion represents the data that is supplied to the data lines of the memory under test. By way of example, algorithmic pattern generator 353 generates 32 address lines. These address lines are connected to each serializer in a bus fashion. Algorithmic pattern generator provides, in a preferred embodiment, two data lines. In prior art testers, each channel connected to a data line of the memory under test was connected to one of the data lines. By changing the values on these data lines, cells in the memory connected to that data line can be tested.

In the illustrated embodiment, the address lines from algorithmic pattern generator 352 run to each of the serializer circuits 410. As can be seen in FIG. 3, each serializer circuit 410 is in series with one of the channels. The data lines from the algorithmic pattern generator for that channel are also input to the serializer.

Serializer circuits 410 accept the output of algorithmic pattern generator 352, which is a string of addresses for the memory under test and data values. For example, a simple test pattern is to have the first bit in every other word in the memory under test alternate values. This was done in the prior art by configuring the tester with the channel connected to data line 1 to be connected to the first data line. The channels connected to all the other data lines would then be connected to the other data line. As the test ran, the algorithmic pattern generator would output addresses increasing sequentially. For each new address, the value on the first data lines would invert. In this way, the first bit of every other word would be inverted.

The same type of pattern can be used to test a memory even though it is accessed through a scan input. It is necessary, though, that the appropriate values be provided to the scan input in the appropriate order. Serializer circuits 410 perform this function. As shown in FIG. 3, the alternative data source select multiplexers 350 in the channels including the serializers 410 can choose between the output of the serializer or the output of algorithmic pattern generator 352. In this way, tester 330 can be operated just as in the prior art or can be configured to operate with the serializers 410.

Figure 4:
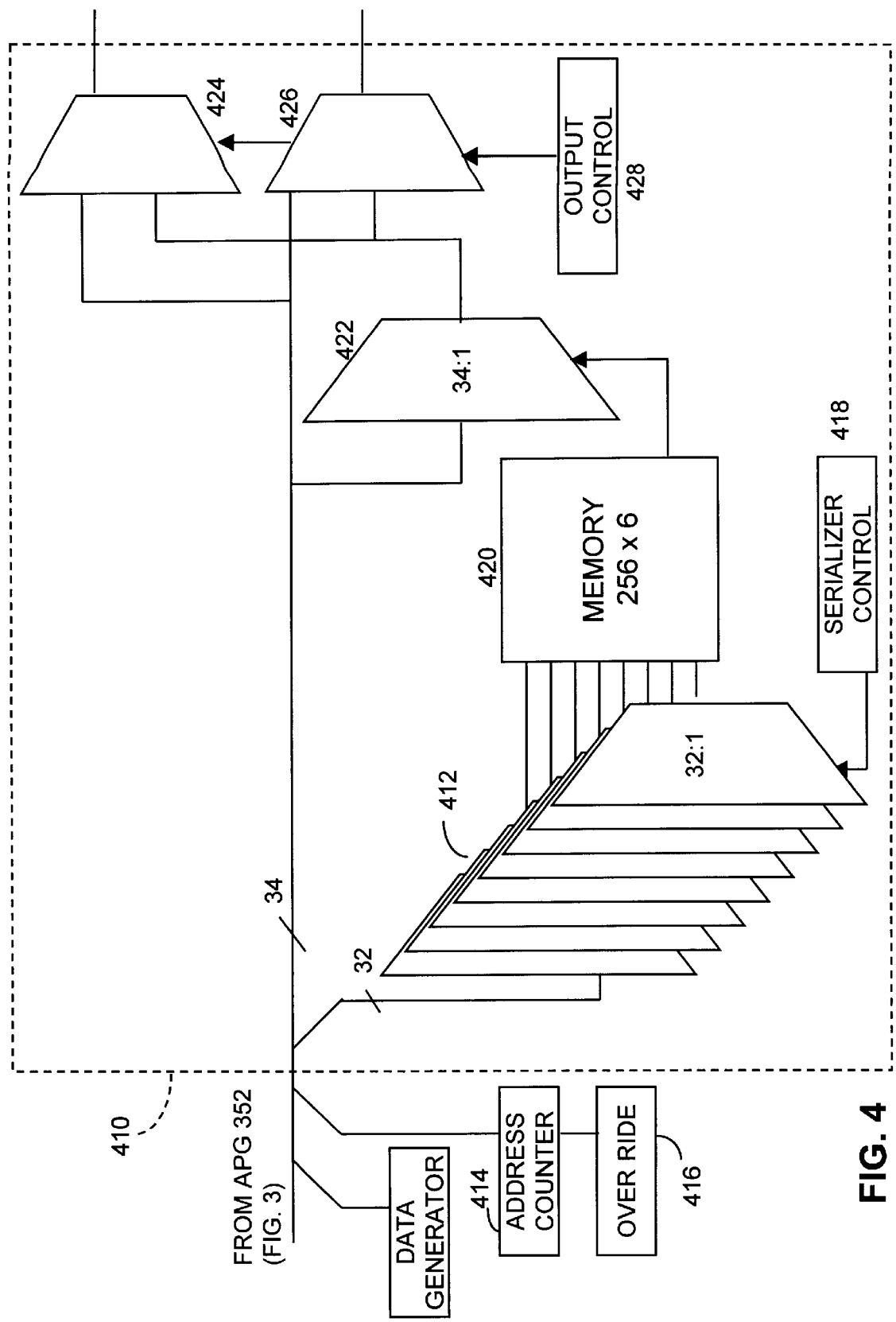
FIG. 4 is a block diagram of the data serializer circuit of FIG. 3.

Turning to FIG. 4, a block diagram of a serializer 410 is shown. Serializer 410 is shown to have a plurality of multiplexers 412. Here, 8 multiplexers 412 are shown. Multiplexers 412 receive as their input the address and data lines from algorithmic pattern generator 352. Serializer control register 418 is programmed so that eight of the address lines are selected to act as address inputs to memory 420.

In the preferred embodiment, the values on eight of the 32 address lines are generated by a separate address counter 414. Typically, these lines will be selected by multiplexers 412. The control register is programmed by a computer work station controlling tester 330, as in the prior art.

Address counter 414 is controlled by an override control circuit 416. Override control circuit is programmed with the length of a scan chain. If, for example, a particular memory under test is a 4K×64 memory, it will have 12 address lines, 64 data inputs and perhaps one control signal. Thus, if a single pin is used to scan into the part, a total of 77 values are required to be scanned into that pin for each value generated by algorithmic pattern generator 352. Counter 414 would be preset by override control circuit 416 to count out the number of values in the scan chain.

The output of multiplexers 412 are the address inputs to memory 420. Memory 420 is programmed with the order of the registers in the scan chain. The first value in memory 420 indicates which of the 34 lines from algorithmic pattern generator 352 contains the data for the last register in the scan chain. The next value in memory 420 indicates which of the 34 lines from algorithmic pattern generator 352 contains the data for the next to last register in the scan chain, and so on.

Memory 420 is loaded with the required values when tester 330 is set up to test a specific type of semiconductor component. Tester 330 is controlled by a computer work station (not shown). Tester 330 is generally set up to perform tests on a specific type of part and then numerous parts of that type are tested. As part of this setup process, control registers and memories, such as memory 420, are loaded with data. The data loaded into memory 420 is specific for the type of part being tested and is derived from information about the order in which the internal address and data lines of a memory under test are connected in a scan chain.

The outputs of memory 420 control a multiplexer 422. Multiplexer 422 selects the appropriate one of the 34 lines from algorithmic pattern generator 352 and passes it to multiplexers 424 and 426.

The outputs of multiplexers 424 and 426 run through alternative data source select multiplexers 350 to the drivers 236 or comparators 238 in the channel containing the serializer. When serializer circuit 410 is in use, multiplexers 424 and 426 are configured to select the output of multiplexer 422. However, serializer circuit 410 can be effectively disabled by controlling multiplexers 424 and 426 to pass through data directly from algorithmic pattern generator 352.

Two multiplexers 424 and 426 are provided for compatibility with the prior art. To control a comparator, two data lines are needed. A comparator can be operated to indicate that its input matches the expected if the input is logic HI or logic LO. Alternatively, the comparator can be set into a "don't care" state, which means that it will indicate that its input matched the expected state regardless of the value of the input. Thus, two bits of data are needed to represent these three possible operating conditions: One bit indicates whether or not the comparator should be in a "don't care" state. The other indicates the expected value. The "don't care" bit appears on a predetermined one of the lines from algorithmic pattern generator 352.

When serializer 410 is used in a channel configured with a comparator, multiplexer 426 is configured to pass through the "don't care" bit. Multiplexer 424 is configured to pass through a data bit from the output of the multiplexer 422. When serializer 410 is used in a channel configured with a driver, only one data bit is needed. Thus, the outputs of multiplexers 424 and 426 are identical and both multiplexers are configured to select the output of multiplexer 422.

Multiplexers 424 and 426 are controlled from output control register 428. As with serializer control register 418, output control register 428 is loaded with a value when tester 330 is set up for a particular test. These values are likewise sent from the computer work station (not shown) that controls tester 330.

In operation, serializers 410 allow an embedded memory 318 or 320 to be tested using an algorithmic pattern generator 252 despite the fact that only a limited number of test points to the memory are present on device under test 312. The algorithmic pattern generator can be easily programmed to generate a test pattern for an embedded memory. In fact, the same programming can be used for any embedded memory of the same size. That program can be developed and debugged once. Great programming savings can be obtained by having program pieces that are device independent and can be used for testing of many types of devices. Less time is needed to write or debug the program to test any device.

Additional savings are made in debug time. When a serializer is used, the test data for the embedded memory is generated in logical fashion. All the data lines can be treated in a logical group, regardless of the order in which they appear in the memory under test. Likewise, the address lines can be treated as a group, regardless of the physical position of the address lines in the embedded memory. It is easier and faster for a human to debug test programs when the data and address values are in logical form.

The serializer circuits 410 associated with each scan chain in each embedded memory being tested are programmed separately. The serializer circuits 410 are programmed once for each scan chain, regardless of the number of tests performed on that memory. Thus, further savings are obtained. These savings are obtained from the novel architecture of the invention.

Having described one embodiment, numerous alternative embodiments or variations might be made. For example, it was described that multiplexers 412 select lines which are derived from a counter. It is not necessary that all of the lines used to address memory 420 be derived from a counter or from the same counter. Memory 420 is shown with eight address lines, allowing it to handle scan chains up to 256 bits long. If the scan chain is not that long, memory 420 can additionally be used for other functions. One possible function is to emulate the "topo invert" function of the prior art. Some memories are designed so that some of the cells in the memory represent a logical one by storing a charge and a logical zero by not storing a charge. Other cells represent data by doing the opposite. At least one line from algorithmic pattern generator 352 indicates a data value. Often, the data lines appear in pairs, with one line of the pair including the invert of the first. When data is provided to a cell that represents a logical 1 by storing a charge, the first line is used. When data is provided to a cell that represents a logical 1 by the absence of a charge, the second line is used. Another line, called a topo line, indicates, for a particular cell, whether the regular or inverted data is needed. Prior art testers included separate circuitry to select between these lines based on the topo line. Selection between the two lines can be made by having the topo lines be selected by multiplexers 412 as some of the address inputs to memory 420. Memory 420 is programmed to select the appropriate data line—either inverted or not—based on the value of the topo bits.

It should also be appreciated that the specifics number of bits and sizes of memories are provided for illustration, and not as a limitation. For example, there might be more than two data lines from the algorithmic pattern generator 352.

Also, a preferred hardware architecture for a tester is shown. However, the serializer circuit might be used with other architectures. For example, it is not necessary that channels be bi-directional. It is possible that some channels drive signals and some channels receive signals.

Further, it should be understood that the serializer circuits 410 could be used in addition to testing performed using the vector pattern memory. Multiplexers 350 can be used to switch between the serialized data or data from the vector pattern memory. In this way, great flexibility can be achieved in testing of components.

Further, FIG. 3 shows that serializer circuits 310 receive data only from an algorithmic pattern generator. It is possible that a serializer might receive data from other sources. For example, the inputs of the serializers might be multiplexed.

Also, it has been described that the serializers are used only in conjunction with algorithmically generated data. An embedded memory might be tested in part with algorithmically generated data and partially by data from a vector pattern. For example, the data and address signals might be algorithmically generated while control signals, such as the write control, might be derived from vector pattern memory.

Therefore, the invention should be limited only by the spirit and scope of the appended claims.

What is claimed is:

1. A tester for a semiconductor device, said semiconductor device having an embedded memory with data and address lines accessible through at least one scan chain and a plurality of test points coupled to the at least one scan chain, the tester comprising:
   a) an algorithmic pattern generator for generating a plurality of output signals in parallel;
   b) a plurality of channels adapted for connecting to said test points, each channel capable of driving or receiving signals at one of said test points; and
   c) a plurality of serializer circuits for converting said output signals for application along said at least one scan chain to said data and address lines of said embedded memory, each serializer circuit including:
      i) a multiplexer having a plurality of data inputs, at least one data output and a control input, the plurality of data inputs connected to receive the plurality of output signals of the algorithmic pattern generator and the output being coupled to one of the plurality of channels; and
      ii) a memory having an address input with a plurality of address lines and a data output coupled to the control input of the multiplexer.

2. The tester of claim 1 wherein the serializer circuit additionally comprises a plurality of second multiplexers, each having a plurality of data inputs and a data output, the data outputs of the plurality of second multiplexers being connected to the address input of the memory and the data inputs being connected to at least a portion of the plurality of output signals from the algorithmic pattern generator.

3. The tester of claim 1 additionally comprising a counter coupled to the address lines of the memory.

4. The tester of claim 3 additionally comprising means for setting the counter based on the length of one of said at least one scan chain.

5. The tester of claim 1 wherein the memory stores a mapping between the plurality of output signals from the algorithmic pattern generator and the order in one of said at least one scan chain that the data and address lines of the embedded memory can be accessed.

6. The tester of claim 1:
   a) additionally comprising a pattern memory; and
   b) wherein a portion of the channels includes a multiplexer configured to select between the output of one of the serializer circuits and the output of the pattern memory.

7. The tester of claim 1 wherein the number of serializer circuits is less than the number of channels.

8. The tester of claim 1 wherein the plurality of output signals of the algorithmic pattern generator are connected to the plurality of data inputs of the multiplexer of each of the plurality of serializer circuits over a bus.

9. The tester of claim 1 wherein a portion of the plurality of channels are configured to drive signals and a portion of the plurality of channels are configured to receive signals.

10. A method of testing a semiconductor device with a tester, said semiconductor device having an embedded memory with data and address lines accessible through at least one scan chain and a plurality of test points coupled to the at least one scan chain, the tester comprising:
    a) an algorithmic pattern generator;
    b) a plurality of channels adapted for connecting to said test points, each channel capable of driving or receiving signals at one of said test points; and
    c) a plurality of serializer circuits, each serializer circuit including a memory;
    said method including the steps of:
       i) loading at least one of said serializer circuit memories with data indicating the order in which data and address lines of the embedded memory are connected in the scan chain;
       ii) connecting a channel to a test point on the semiconductor device under test connected to the scan chain;
       iii) operating the algorithmic pattern generator to generate a stream of values for the address and data lines of the embedded memory; and
       iv) operating the serializer circuit to select, in accordance with the order specified by the data loaded in the memory, to route the values for the address and data lines to the channel.

11. The method of claim 10 wherein said tester includes:
    a) a pattern memory having a plurality of outputs; and
    b) a plurality of multiplexers connected to at least a portion of the plurality of channels, said method further including the step of selecting between one of the plurality of outputs of the pattern memory and the outputs of one of the plurality of serializer circuits with said plurality of multiplexers.

12. The method of claim 11 and further including the step of simultaneously providing data from at least one of the serializer circuits and the pattern memory.

13. A tester for a semiconductor device having an embedded memory with data and address lines accessible through at least one scan chain, the tester comprising:
    a) means for algorithmically generating a pattern of address bits and data bits to be applied to the embedded memory;
    b) a first channel circuit having a driver with a data input and an output;
    c) a second channel circuit having a comparator with a signal input, a data input and an output;
    d) a first means for receiving an output of the means for algorithmically generating a pattern and, in accordance with a programmable order, sequentially applying the address bits and data bits to the data input of the first channel; and e) a second means for receiving an output of the means for algorithmically generating a pattern and, in accordance with a programmable order, sequentially applying the address bits and data bits to the data input of the second channel.

14. The tester of claim 13 wherein the first means for receiving comprises memory storing information on said programmable order.

15. The tester of claim 14 additionally comprising a counter coupled to said first means for receiving for providing address inputs to the memory.

16. The tester of claim 15 wherein said first means for receiving further includes:

a) a plurality of multiplexers, said multiplexers respectively having control inputs, a plurality of input lines and an output line,
   said plurality of input lines includes respective first and second portions, said first portion being connected to the counter;
   said second portion of the plurality of input lines is connected to receive outputs from the means for algorithmically generating a pattern; and
   the output line is connected to said address input of the memory; and b) a programmable control register connected to the control inputs of the plurality of multiplexers.

* * * * *